United States Patent [19]
Lee et al.

[11] Patent Number: 5,740,741
[45] Date of Patent: Apr. 21, 1998

[54] METHOD AND APPARATUS FOR CONVEYING AN ARTICLE ON A VEHICLE

[75] Inventors: Ban Jaw Lee, Hsib-chu; Chen Chin Chen, Miao-Li Hsien; Jiunn Shyong Shu; Mi Kan Chang, both of Hsin-Chu; Wu Jan Chena, Hsin-Chu Hsien, all of Taiwan

[73] Assignee: Taiwan Semiconductor Manufacturing Co., Ltd., Hsin-Chu, Taiwan

[21] Appl. No.: 781,717

[22] Filed: Jan. 10, 1997

[51] Int. Cl.⁶ .................................. B60K 28/00
[52] U.S. Cl. .................. 104/288; 104/249; 180/271; 180/290
[58] Field of Search .................. 104/88.01, 118, 104/288, 249, 307; 180/271, 272, 273, 277, 290, 65.8, 68.5, 41; 105/27

[56] References Cited

U.S. PATENT DOCUMENTS

| | | | |
|---|---|---|---|
| 4,743,213 | 5/1988 | Nishida | 180/273 |
| 5,014,811 | 5/1991 | Valencic et al. | 180/290 |
| 5,109,945 | 5/1992 | Koga | 180/272 |

*Primary Examiner*—Mark T. Le
*Attorney, Agent, or Firm*—Barnes, Kisselle, Raisch, Choate, Whittemore & Hulbert, P.C.

[57] ABSTRACT

The present invention is a method and apparatus for conveying an article on a loading platform of a vehicle by installing sensor switches on the top surface of the loading platform so that the proper loading of an article on the vehicle can be monitored and ensured in such a way that the movement of the vehicle can be stopped when the sensor switches sense an improper positioning of the article.

23 Claims, 1 Drawing Sheet

METHOD AND APPARATUS FOR CONVEYING AN ARTICLE ON A VEHICLE

FIELD OF THE INVENTION

The present invention generally relates to a method and apparatus for conveying an article on a vehicle and more particularly, relates to a method and apparatus for conveying a container of semiconductor wafers on a vehicle between processing stations in a semiconductor fabrication plant wherein the vehicle is equipped with sensing devices and a controller capable of stopping the vehicle movement when the container is not properly positioned on the vehicle.

BACKGROUND OF THE INVENTION

In the fabrication of semiconductor devices, a semiconducting wafer must be processed in a multiplicity of fabrication steps, i.e., as many as several hundred, in order to complete the fabrication of an IC device. The multiplicity of fabrication steps may include deposition, etching, cleaning and various other processing procedures. Since semiconductor fabrication plant must operate under extremely clean conditions to avoid the contamination of wafers, the human handling of the wafers must be minimized. To achieve the goal of minimum handling by the plant personnel, the semiconductor wafers are normally conveyed between work stations in an automated manner.

One of the automated methods of transporting wafers between work stations or process machines is by loading the wafers into a pod and then transporting the pod on an automated vehicle which rides on tracks established between work stations. A pod is a container for holding semiconductor wafers that normally has an opening at the bottom for the loading and unloading of wafers to avoid contamination.

A typical wafer conveying system is shown in FIGS. 1 and 2. FIG. 1 is a perspective view of a vehicle that is normally used in transporting semiconductor wafers between processing stations in a fabrication plant. The vehicle 10 generally has a top portion 12 and a bottom portion 14. The top portion 12 is generally constructed in a laterally extended top surface 16 for the placement of a wafer container. The bottom portion 14 generally consists of a drive means (not shown) such that the vehicle 10 can ride on a track 32 (FIG. 2). The drive means installed in the bottom portion 14 may be suitably an electric motor operated by a battery system or an electric power conveyed by the track 32. Other suitable drive means such as pneumatic power may also be used. On the top portion 12, a ledge 22 is normally provided which surrounds the top surface 16 and prevents the accidental sliding off of the wafer container 34 from the vehicle 10.

As shown in FIG. 2, a wafer container 34, or commonly known as a pod, which contains a multiplicity of wafers is positioned on the top surface 16 (or loading platform) of the vehicle 10. The pod 34 is further equipped with a tag 36 positioned on one side of the pod for identification purpose. The pod is normally loaded through an opening at the bottom such that contamination to the wafers can be minimized. The vehicle 10 can be driven by the electric motor (not shown) and rides on track 32 established between process machines or work stations.

A major draw back of the conventional system shown in FIGS. 1 and 2 is that when the pod 36 is not properly positioned on the top surface 16 of vehicle 10, for instance, a bottom edge of the pod 34 sits on top of one side of the ledge 22, the pod may fall off the vehicle during movement on the track 32. Even when the pod is properly positioned on the top surface 16 of the vehicle 10 initially, any accidental interference with the pod 34 during transit may move the pod to a position it may tip over or fall of the vehicle 10. When the pod 34 falls off the vehicle 10, a large quantity of wafers may break or be otherwise damaged during the fall. The loss of a number of wafers is therefore extremely expensive and causes a severe yield drop in the fabrication plant.

It is therefore an object of the present invention to provide an apparatus for conveying articles on a vehicle that does not have the drawbacks and shortcomings of the conventional apparatus.

It is another object of the present invention to provide an apparatus for conveying articles on a vehicle between process stations in a semiconductor fabrication plant that can effectively prevent the article from falling off the vehicle during transit.

It is a further object of the present invention to provide an apparatus for conveying an article on a vehicle between processing stations in a semiconductor fabrication plant wherein the proper positioning of the article on the vehicle and thus the safe transport of the article can be assured.

It is still another object of the present invention to provide an apparatus for conveying articles on a vehicle transported between process stations in a semiconductor fabrication plant by installing sensor devices on the top loading platform of the vehicle.

It is yet another object of the present invention to provide an apparatus for conveying articles on a vehicle between processing stations in a semiconductor fabrication plant that utilizes micro-switches installed in the top surface of the vehicle such that improper positioning of the article can be detected.

It is another further object of the present invention to provide an apparatus for conveying articles on a vehicle between processing stations in a semiconductor fabrication plant that is equipped with sensing devices and a controller such that the controller can stop the motion of the vehicle when the sensing device detects an improper positioning of the article on the vehicle.

It is still another further object of the present invention to provide an apparatus for conveying articles on a vehicle between processing stations in a semiconductor fabrication plant by utilizing sensors and a controller equipped with a logic circuit capable of detecting improperly positioned article on the vehicle.

It is yet another further object of the present invention to provide a method of conveying articles on a vehicle in a semiconductor fabrication plant by installing sensors and a controller on the vehicle capable of stopping the vehicle when the sensor detects an improperly positioned article on the vehicle.

SUMMARY OF THE INVENTION

The present invention provides a method and apparatus for conveying articles on a vehicle between processing stations in a factory that is capable of detecting whether the article is properly positioned on the vehicle and thus ensures the safe transport of the article by utilizing sensor devices and a controller for receiving and outputting signals to the vehicle.

In a preferred embodiment, a method for conveying an article on a vehicle can be carried out by first providing a vehicle that has generally a laterally extended top surface for carrying an article, then providing at least two sensors in the laterally extended top surface capable of sensing the presence of an article, the at least two sensors are positioned sufficiently apart and yet capable of being covered by the article, then providing a controller capable of receiving signals from the sensors, then transmitting a first signal from the controller when the at least two sensors are both covered by the article, a second signal when the at least two sensors are both uncovered by the article, and a third signal when one of the at least two sensors are covered and one of the at least two sensors are uncovered by the article, and then moving the vehicle when the first or the second signal is transmitted from the controller, and stopping the vehicle when the third signal is transmitted from the controller.

The present invention is also directed to a vehicle for transporting an article which includes a vehicle body which has a top portion and a bottom portion, a laterally extended top surface on the top portion of the vehicle body, a drive means for driving the vehicle mounted in the bottom portion of the vehicle body, at least two detection means mounted in the laterally extended top surface of the top portion of the vehicle body, the at least two detection means are mounted sufficiently apart and yet capable of being covered by the article, and a controller for receiving signals from the detection means and outputting signals to the drive means to drive or stop the vehicle.

The present invention is further directed to a conveyor system for conveying an article on a vehicle that includes a vehicle which has a laterally extended top surface for carrying the article and a drive system, the laterally extended top surface has at least two sensors mounted therein for sensing the presence of the article, the at least two sensors are positioned substantially apart and yet capable of being covered by the article, a track for engaging the drive system of the vehicle, and a controller for receiving signals transmitted from the at least two sensors and outputting a signal to the drive system to drive the vehicle when the at least two sensors are both covered by the article, when the at least two sensors are both uncovered by the article, and to stop the vehicle when one of the at least two sensors are covered and one of the at least two sensors are uncovered by the article.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method and apparatus for conveying an article on a vehicle between processing stations in a factory by providing sensors on the top surface of the vehicle loading platform so that an improperly loaded article stops the vehicle from movement and prevents it from falling off the vehicle.

Figure 1:
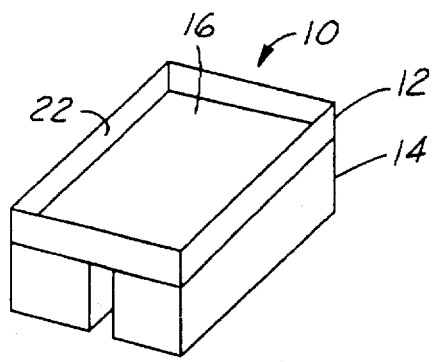
FIG. 1 is a perspective view of a conventional vehicle for transporting articles.
Figure 2:
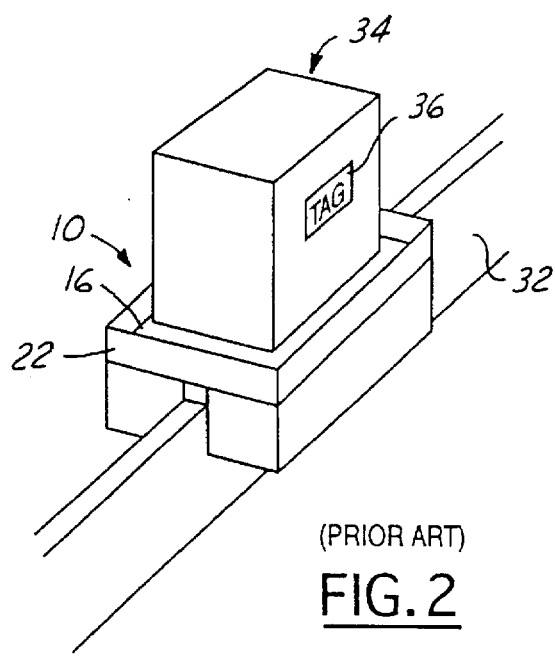
FIG. 2 is a perspective view of the vehicle shown in FIG. 1 carrying a wafer container and riding on a track.
Figure 3:
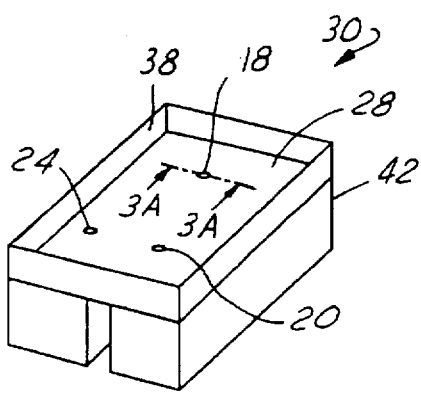
FIG. 3 is a present invention vehicle equipped with sensor devices.

In the preferred embodiment, as shown in FIG. 3, a vehicle 30 which has a generally laterally extended top surface 28 (or a loading platform) for carrying an article (not shown) is provided. Three sensors, 18 ($S_1$), 24 ($S_2$) and 20 ($S_3$) are provided in the laterally extended top surface 28 or the loading platform of the vehicle 30. It should be noted that the three sensors are positioned sufficiently apart and yet capable of being covered by the article to be carried on the loading platform. The desirability of positioning the three sensors sufficiently apart is based on the fact it provides a larger coverage of the bottom surface of the article to be carried to ensure that the article is properly positioned on the top surface 28. A ledge 38 is provided along the periphery of the top surface 28. The ledge 38 functions as a stop to prevent the accidental sliding of the article from the top surface 28. The bottom portion 42 of the vehicle 30 houses a drive means (not shown) for driving the vehicle on a track (not shown). The drive means can be suitably an electric motor that is powered by battery or by power fed through the track.

It should be noted that while at least two sensors are required in the top surface 28 of the vehicle 30 in order to effectively determine the proper positioning of an article, it is desirable to use three sensors 18, 20 and 24 to be positioned in the top surface 28 of the vehicle 30. Obviously, more sensors, such as 4, 5 or 6 may also be positioned in the top surface depending on the geometry of the article that is being carried by the vehicle 30.

Figure 3A:
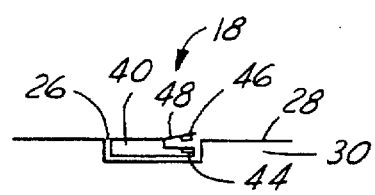
FIG. 3A is an enlarged, cross-sectional view of the sensor device shown in FIG. 3.

An enlarged cross-sectional view taken along line 3—3 in FIG. 3 is shown in FIG. 3A. The sensor 18 is shown positioned in a recessed pocket 26 in the top surface 28 of the vehicle 30. The sensor 18 consists of a sensor body 40 which has a fixed electrical contact 44 and a movable contact 46 installed at the tip of a spring arm 48. The movable contact 46 installed at the tip of the spring arm 48 protrudes above the top surface 28 of the vehicle 30 and therefore acts as a sensor for detecting the presence of an article being placed on the top surface which closes contacts 44, 46 and sends out a signal. It should be noted that the sensor 18 shown in FIG. 3A is only one of many possible sensors that can be utilized in the present invention apparatus. For instance, sensor 18 is a normal open type sensor, while a normal closed type sensor that will open upon loading of an article on top may also be utilized. Sensor 18 is typically an electrically operated micro-switch.

Figure 4:
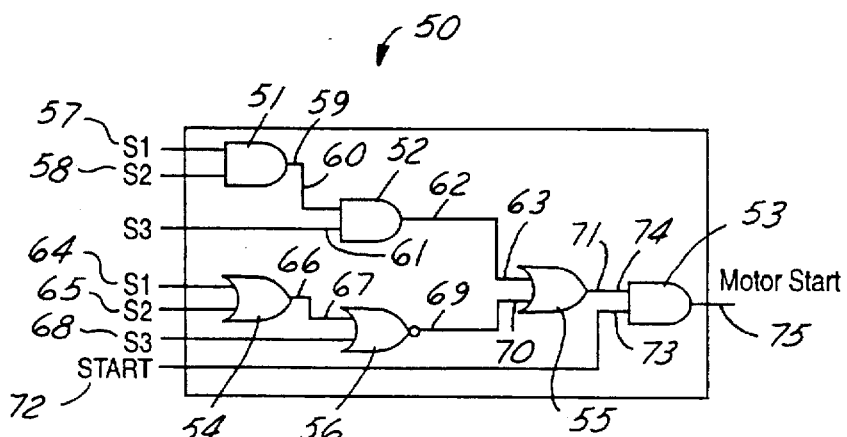
FIG. 4 is a logic circuit in the controller.

The operation of the present invention apparatus upon the loading of an article on top of the loading platform 28 can be described as follows. The outputs of the sensor devices 18, 20 and 24 are fed into a controller which has a logic circuit as shown in FIG. 4. Referring now to FIG. 4, an electronic circuit 50 for controlling the positioning of an article placed on top of a vehicle is shown which includes a first, a second, and a third AND gates 51, 52 and 53, respectively, a first and a second OR gates 54 and 55, respectively, and a NOR gate 56. Input signals $S_1$, $S_2$ and $S_3$ are present (or in other words, are high or in the "1" state) if the article touch the respective micro-switches on top of the vehicle, i.e., the article is positioned properly. The micro-switches that are not touched and send no input signals to the circuit 50 (or in other words, the signals $S_1$, $S_2$ or $S_3$ are low, or in the "0" state).

It is only when all input signals $S_1$, $S_2$ and $S_3$ are high (or all of them are low which means that there are no article on top of the vehicle) that the circuit 50 generates a high output signal at the output end of the third AND gate 53. As a matter of fact, when $S_1$, $S_2$ and $S_3$ are high, inputs 57 and 58 of the first AND gate 51 are high, output 59 of the first AND gate 51 goes high. Therefore, inputs 60 and 61 of the second AND gate 52 are high, and the output 62 of the second AND gate 52 goes high. Inputs of the first OR gate 54 are high, the output 66 of the first OR gate goes high, and with inputs 67, 68 of the NOR gate 56 being high, the output 69 of the NOR gate 56 is low. With the inputs 63 and 70 of the second OR gate 55 being high and low, respectively, the output 71 of the second OR gate goes high. At the presence of a start signal 72, there are two high signals at inputs 73, 74 of the third AND gate 53, and its output 75 also goes high.

When all three input signals $S_1$, $S_2$ and $S_3$ are low, which means that there are no article on top of the vehicle, the output 59 of the first AND gate 51 goes low, so does the output 62 of the second AND gate 52, and the output 66 of the first OR gate 54. The output 69 of the NOR gate 56 goes high, the output 71 of the second OR gate 55 also goes high, and at the presence of the start signal 72, there are two high signals at inputs 73, 74 of the third AND gate 53, and its output 75 also goes high.

If any of the input signals $S_1$, $S_2$ or $S_3$ is low where other input signals (or signal) are (is) high, the outputs 59 or 62 of the first or second AND gates 51, 52, respectively, are low. At the same time, the output 69 of the NOR gate 56 is low, therefore the output 71 of the second OR gate 55 is low which results in the output 75 of the third AND gate 53 being low as well.

The above considerations are fully confirmed and illustrated by a truth table shown in Table I.

TABLE I

| S1 | S2 | S3 | X | Y | W |
|----|----|----|---|---|---|
| 0  | 0  | 0  | 0 | 1 | 1 |
| 0  | 0  | 1  | 0 | 0 | 0 |
| 0  | 1  | 0  | 0 | 0 | 0 |
| 0  | 1  | 1  | 0 | 0 | 0 |
| 1  | 0  | 0  | 0 | 0 | 0 |
| 1  | 0  | 1  | 0 | 0 | 0 |
| 1  | 1  | 0  | 0 | 0 | 0 |
| 1  | 1  | 1  | 1 | 0 | 1 |

The present invention method and apparatus for conveying an article on a vehicle that utilizes sensor devices on top of the vehicle to ensure the safe transport of an article on a moving vehicle is fully demonstrated and illustrated above. It should be noted that while the transport of semiconductor wafers is used as an illustration of the present invention method and apparatus, the present invention is in no way limited to such application. The present invention can be broadly applied to any applications as long as the loading of an article on a vehicle and the moving of such vehicle are involved.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for conveying an article on a vehicle comprising the steps of:

providing a vehicle having generally a laterally extended top surface for carrying an article, providing at least two sensors in said laterally extended top surface capable of sensing the presence of an article, said at least two sensors being positioned sufficiently apart and yet capable of being covered by said article, providing a controller capable of receiving signals from said sensors, transmitting a first signal from said controller when said at least two sensors are both covered by said article, a second signal when said at least two sensors are both uncovered by said article, and a third signal when one of said at least two sensors is covered and one of said at least two sensors is uncovered by said article, and moving said vehicle when said first or said second signal is transmitted from said controller, and stopping said vehicle when said third signal is transmitted from said controller.

2. A method according to claim 1, wherein said vehicle is operated by an electric motor.

3. A method according to claim 1, wherein said vehicle is operated on a track.

4. A method according to claim 1, wherein said at least two sensors are mounted in recessed areas in said laterally extended top surface of said vehicle.

5. A method according to claim 1, wherein said at least two sensors are micro-switches mounted in recessed areas in said laterally extended top surface of said vehicle.

6. A method according to claim 1, wherein said article comprises a container for semiconductor wafers.

7. A method according to claim 1, wherein said controller comprises at least two of the logic devices of an AND gate, an OR gate and a NOR gate.

8. A method according to claim 1, wherein said controller comprises AND, OR and NOR gates.

9. A method according to claim 1, wherein said laterally extended top surface of said vehicle further comprising a ledge surrounding said top surface for preventing said article from sliding off said top surface.

10. A method according to claim 1, wherein said article is a pod for transporting semiconductor wafers.

11. A method according to claim 1, wherein said controller provides a stop or go signal to said vehicle based on the output of a logic circuit.

12. A vehicle for transporting an article comprising:

a vehicle body having a top portion and a bottom portion, a laterally extended top surface on said top portion of the vehicle body, a drive means for driving said vehicle mounted in said bottom portion of the vehicle body, at least two detection means mounted in said laterally extended top surface of said top portion of the vehicle body, said at least two detection means are mounted sufficiently apart and yet capable of being covered by said article, and a controller for receiving signals from said detection means and outputting signals to said drive means to drive or stop said vehicle.

13. A vehicle according to claim 12, wherein said drive means is an electric motor.

14. A vehicle according to claim 12, wherein said at least two detection means are micro-switches.

15. A vehicle according to claim 12, wherein said controller comprises a logic circuit.

16. A vehicle according to claim 12, wherein said controller is a logic circuit consists of at least two logic devices selected from the group consisting of an AND gate, an OR gate and a NOR gate.

17. A vehicle according to claim 12, wherein said article is a container for semiconductor wafers.

18. A conveyor system for conveying an article on a vehicle comprising:

a vehicle having a laterally extended top surface for carrying an article and a drive system, said laterally extended top surface having at least two sensors mounted therein for sensing the presence of the article, said at least two sensors are positioned substantially apart and yet capable of being covered by the article, a track for engaging the drive system of said vehicle, and a controller for receiving signals transmitted from said at least two sensors and outputting a signal to said drive system to drive said vehicle when said at least two sensors are both covered by said article, when said at least two sensors are both uncovered by said article, and to stop said vehicle when one of said at least two sensors is covered and one of said at least two sensors is uncovered by said article.

19. A conveyor system according to claim 18, wherein said track for engaging the drive system of the vehicle connects two processing stations in a semiconductor fabrication plant.

20. A conveyor system according to claim 18, wherein said drive system for said vehicle is an electric motor.

21. A conveyor system according to claim 18, wherein said at least two sensors are micro-switches mounted in recessed areas in said laterally extended top surface of said vehicle.

22. A conveyor system according to claim 18, wherein said controller is a logic circuit comprises AND, OR and NOR gates.

23. A conveyor system according to claim 18, wherein said article being carried by said conveyor system is a container for semiconductor wafers.

\* \* \* \* \*